United States Patent
Ranjan et al.

(10) Patent No.: US 9,028,666 B2
(45) Date of Patent: May 12, 2015

(54) WETTING WAVE FRONT CONTROL FOR REDUCED AIR ENTRAPMENT DURING WAFER ENTRY INTO ELECTROPLATING BATH

(75) Inventors: Manish Ranjan, Tualatin, OR (US); Shantinath Ghongadi, Tigard, OR (US); Frederick Dean Wilmot, Gladstone, OR (US); Douglas Hill, Tualatin, OR (US); Bryan L. Buckalew, Tualatin, OR (US)

(73) Assignee: Novellus Systems, Inc., Fremont, CA (US)

( * ) Notice: Subject to any disclaimer, the term of this patent is extended or adjusted under 35 U.S.C. 154(b) by 493 days.

(21) Appl. No.: 13/460,423

(22) Filed: Apr. 30, 2012

(65) Prior Publication Data

US 2012/0292192 A1 Nov. 22, 2012

Related U.S. Application Data

(60) Provisional application No. 61/487,207, filed on May 17, 2011.

(51) Int. Cl.
   *C25D 5/00* (2006.01)
   *C25D 17/00* (2006.01)
   *C25D 7/12* (2006.01)
   *H01L 21/288* (2006.01)

(52) U.S. Cl.
   CPC *C25D 7/123* (2013.01); *C25D 5/00* (2013.01); *C25D 17/001* (2013.01); *H01L 21/2885* (2013.01)

(58) Field of Classification Search
   CPC ....................................................... C25D 7/123
   USPC .................................................. 205/137, 157
   See application file for complete search history.

(56) References Cited

U.S. PATENT DOCUMENTS

| | | |
|---|---|---|
| 1,225,395 A | 2/1918 | Duram |
| 3,849,002 A | 11/1974 | Hach |
| 4,092,226 A | 5/1978 | Laing et al. |
| 4,101,919 A | 7/1978 | Ammann |
| 4,229,191 A | 10/1980 | Moore |
| 4,272,335 A | 6/1981 | Combs |
| 4,297,217 A | 10/1981 | Hines et al. |
| 4,459,194 A | 7/1984 | Fletcher et al. |
| 4,461,680 A | 7/1984 | Lashmore |
| 4,563,399 A | 1/1986 | Wright, Jr. |

(Continued)

FOREIGN PATENT DOCUMENTS

WO     WO99/41434     8/1999

OTHER PUBLICATIONS

Patton et al., "Methods and Apparatus for Bubble Removal in Wafer Wet Processing," U.S. Appl. No. 09/872,340, filed May 31, 2001, pp. 1-40.

U.S. Office Action dated Oct. 3, 2002, issued in U.S. Appl. No. 09/872,341.

(Continued)

*Primary Examiner* — Bryan D. Ripa
(74) *Attorney, Agent, or Firm* — Weaver Austin Villeneuve & Sampson LLP

(57) ABSTRACT

Methods described herein manage wafer entry into an electrolyte so that air entrapment due to initial impact of the wafer and/or wafer holder with the electrolyte is reduced and the wafer is moved in such a way that an electrolyte wetting wave front is maintained throughout immersion of the wafer also minimizing air entrapment.

28 Claims, 9 Drawing Sheets

(56) References Cited

U.S. PATENT DOCUMENTS

| | | | |
|---|---|---|---|
| 4,975,159 A | 12/1990 | Dahms | |
| 5,000,827 A | 3/1991 | Schuster et al. | |
| 5,221,449 A | 6/1993 | Colgan et al. | |
| 5,252,196 A | 10/1993 | Sonnenberg et al. | |
| 5,281,485 A | 1/1994 | Colgan et al. | |
| 5,368,711 A | 11/1994 | Poris | |
| 5,482,605 A | 1/1996 | Taylor | |
| 5,482,611 A | 1/1996 | Helmer et al. | |
| 5,618,634 A | 4/1997 | Hosoda et al. | |
| 5,831,727 A | 11/1998 | Stream | |
| 5,935,762 A | 8/1999 | Dai et al. | |
| 5,936,707 A | 8/1999 | Nguyen et al. | |
| 5,939,788 A | 8/1999 | McTeer | |
| 5,969,422 A | 10/1999 | Ting et al. | |
| 5,972,192 A | 10/1999 | Dubin et al. | |
| 5,985,762 A | 11/1999 | Geffken et al. | |
| 6,004,470 A | 12/1999 | Abril | |
| 6,074,544 A | 6/2000 | Reid et al. | |
| 6,099,702 A | 8/2000 | Reid et al. | |
| 6,099,711 A | 8/2000 | Dahms et al. | |
| 6,099,712 A | 8/2000 | Ritzdorf et al. | |
| 6,110,346 A | 8/2000 | Reid et al. | |
| 6,113,771 A | 9/2000 | Landan et al. | |
| 6,117,784 A | 9/2000 | Uzoh | |
| 6,124,203 A | 9/2000 | Joo et al. | |
| 6,126,798 A | 10/2000 | Reid et al. | |
| 6,132,584 A | 10/2000 | Hubel | |
| 6,139,712 A | 10/2000 | Patton et al. | |
| 6,140,241 A | 10/2000 | Shue et al. | |
| 6,156,167 A | 12/2000 | Patton et al. | |
| 6,159,354 A | 12/2000 | Contolini et al. | |
| 6,162,344 A | 12/2000 | Reid et al. | |
| 6,168,693 B1 | 1/2001 | Uzoh et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,197,179 B1 | 3/2001 | Arlt et al. | |
| 6,197,181 B1 | 3/2001 | Chen | |
| 6,203,684 B1 | 3/2001 | Taylor et al. | |
| 6,217,716 B1 | 4/2001 | Fai Lai | |
| 6,221,757 B1 | 4/2001 | Schmidbauer et al. | |
| 6,251,242 B1 | 6/2001 | Fu et al. | |
| 6,261,433 B1 | 7/2001 | Landau | |
| 6,274,008 B1 | 8/2001 | Gopalraja et al. | |
| 6,277,249 B1 | 8/2001 | Gopalraja et al. | |
| 6,395,101 B1 | 5/2002 | Scranton et al. | |
| 6,413,388 B1 | 7/2002 | Uzoh et al. | |
| 6,503,376 B2 | 1/2003 | Toyoda et al. | |
| 6,540,899 B2 | 4/2003 | Keigler | |
| 6,551,487 B1 * | 4/2003 | Reid et al. | 205/137 |
| 6,582,578 B1 | 6/2003 | Dordi et al. | |
| 6,796,877 B1 | 9/2004 | Bingham et al. | |
| 6,800,187 B1 | 10/2004 | Reid et al. | |
| 6,946,065 B1 | 9/2005 | Mayer et al. | |
| 6,964,792 B1 | 11/2005 | Mayer et al. | |
| 7,097,410 B1 | 8/2006 | Reid et al. | |
| 7,686,927 B1 | 3/2010 | Reid et al. | |
| 7,727,863 B1 | 6/2010 | Buckalew et al. | |
| 8,048,280 B2 | 11/2011 | Mayer et al. | |
| 2002/0029973 A1 | 3/2002 | Maydan | |
| 2002/0084183 A1 | 7/2002 | Hanson et al. | |
| 2002/0084189 A1 | 7/2002 | Wang et al. | |
| 2006/0011483 A1 | 1/2006 | Mayer et al. | |
| 2006/0201814 A1 * | 9/2006 | Hafezi et al. | 205/102 |
| 2008/0057211 A1 * | 3/2008 | Chen et al. | 427/430.1 |
| 2008/0149489 A1 * | 6/2008 | Varadarajan et al. | 205/137 |
| 2014/0224661 A1 | 8/2014 | Spurlin et al. | |

OTHER PUBLICATIONS

U.S. Office Action dated May 15, 2003, issued in U.S. Appl. No. 09/927,741.

U.S. Final Office Action dated Oct. 7, 2003, issued in U.S. Appl. No. 09/927,741.

U.S. Office Action dated Feb. 20, 2004, issued in U.S. Appl. No. 09/927,740.

U.S. Office Action dated Feb. 26, 2004, issued in U.S. Appl. No. 09/927,741.

U.S. Office Action dated Jul. 15, 2004, issued in U.S. Appl. No. 09/927,740.

U.S. Office Action dated Apr. 14, 2005, issued in U.S. Appl. No. 09/872,340.

U.S. Office Action dated Jun. 27, 2005, issued in U.S. Appl. No. 10/379,858.

U.S. Office Action dated Aug. 31, 2005, issued in U.S. Appl. No. 09/872,340.

U.S. Final Office Action dated Dec. 14, 2005, issued in U.S. Appl. No. 10/379,858.

U.S. Final Office Action dated Jan. 18, 2006, issued in U.S. Appl. No. 09/872,340.

U.S. Office Action dated May 26, 2006, issued in U.S. Appl. No. 09/872,340.

U.S. Office Action dated Nov. 8, 2006, issued in U.S. Appl. No. 09/872,340.

U.S. Final Office Action dated Mar. 14, 2007 issued in U.S. Appl. No. 09/872,340.

U.S. Notice of Allowance dated Jun. 1, 2004 issued in U.S. Appl. No. 09/927,741.

U.S. Notice of Allowance dated Feb. 5, 2003, issued in U.S. Appl. No. 09/872,341.

U.S. Notice of Allowance dated Jun. 8, 2006, issued in U.S. Appl. No. 10/379,858.

U.S. Notice of Allowance dated Dec. 8, 2004, issued in U.S. Appl. No. 09/927,740.

U.S. Office Action dated Jun. 26, 2009 issued in U.S. Appl. No. 11/510,048.

U.S. Notice of Allowance dated Nov. 19, 2009 issued in U.S. Appl. No. 11/510,048.

US Office Action dated May 28, 2002 issued in U.S. Appl. No. 09/716,016.

US Office Action dated Jan. 6, 2003 issued in U.S. Appl. No. 09/716,016.

US Final Office Action dated Feb. 4, 2004 issued in U.S. Appl. No. 09/716,016.

US Notice of Allowance dated Apr. 21, 2004 issued in U.S. Appl. No. 09/716,016.

US Office Action dated Jun. 10, 2009 issued in U.S. Appl. No. 11/228,712.

US Final Office Action dated Jan. 7, 2010 issued in U.S. Appl. No. 11/228,712.

US Office Action dated Oct. 12, 2010 issued in U.S. Appl. No. 11/228,712.

US Final Office Action dated Apr. 29, 2011 issued in U.S. Appl. No. 11/228,712.

US Notice of Allowance dated Aug. 16, 2011 issued in U.S. Appl. No. 11/228,712.

US Office Action dated Jul. 19, 2013 issued in U.S. Appl. No. 13/286,103.

US Final Office Action dated Nov. 8, 2013 issued in U.S. Appl. No. 13/286,103.

Chang, C.Y. and Sze, S.M., Editors (1996) "ULSI Technology," Eds, *McGraw-Hill*, 1996, pp. 444-445.

Contolini, Robert J., Tarte, Lisa, Graff, Robert T., Evans, Lee B., Cox, J. Neal, Puich, Marc R., Gee, Justin E., Mu, Xiao-Chun, Chiang, Chien (Jun. 27-29, 1995) "Copper Electroplating Process for Sub-Half-Micron ULSI Structures," *VMIC Conf.* pp. 322-325.

Dubin, Valery M., Shacham-Diamand, Yosi, Zhao, Bin, Vasudev, P.K., Ting, Chiu H. (Jun. 26 & 27, 1995) "Selective and Blanket Electroless Cu Plating Initiated by Contact Displacement for Deep Submicron Via Contact Filling," *VMIC Conf.* pp. 314-321.

Lowenheim, Fredereick A., (1978) "Electroplating," *McGraw-Hill Book Company*, pp. 128-129.

Lowenheim, Fredereick A., (1978) "Electroplating," *McGraw-Hill Book Company*, p. 423.

* cited by examiner

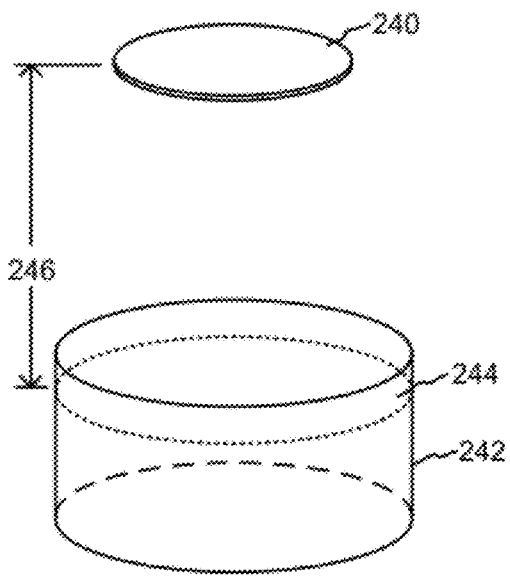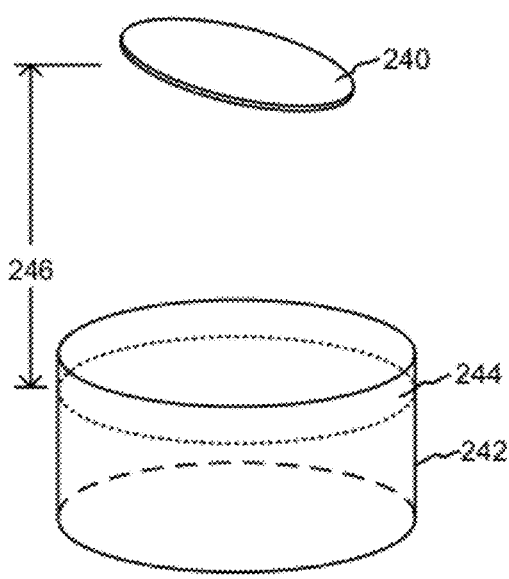
FIG. 2A              FIG. 2B
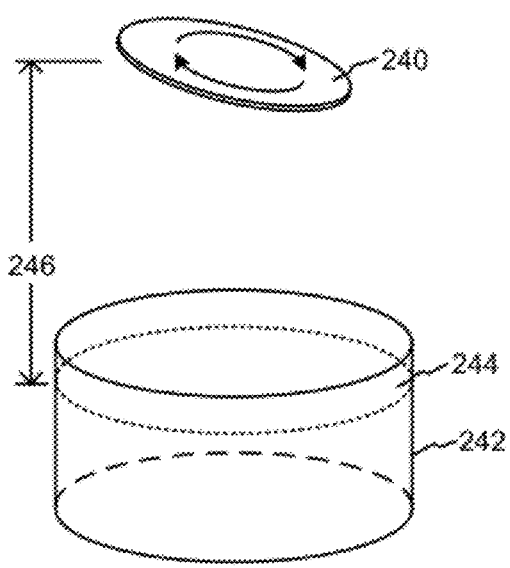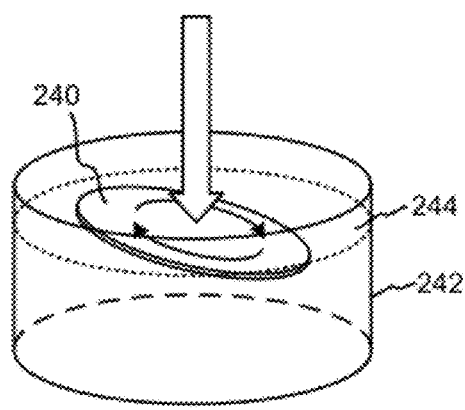
FIG. 2C              FIG. 2D

WETTING WAVE FRONT CONTROL FOR REDUCED AIR ENTRAPMENT DURING WAFER ENTRY INTO ELECTROPLATING BATH

CROSS-REFERENCE TO RELATED APPLICATIONS

This application claims benefit under 35 U.S.C. §119(e) to U.S. Provisional Patent Application No. 61/487,207, titled "Wetting Wave Front Control for Reduced Air Entrapment during Wafer Entry into Electroplating Bath", naming Ranjan et al. as inventors, filed May 17, 2011, which is herein incorporated by reference in its entirety and for all purposes.

INTRODUCTION

1. Field

The present disclosure relates generally to electroplating. More specifically, disclosed herein are methods and apparatus for reducing air entrapment during wafer entry into an electrolyte.

2. Background

Electroplating has many applications. One very important application is in plating copper onto semiconductor wafers to form conductive copper lines for "wiring" individual devices of the integrated circuit. Often this electroplating process serves as a step in, for example, a Damascene fabrication procedure.

A continuing issue in modern wafer electroplating processing is quality of the deposited metal film. Given that metal line widths reach into the deep sub-micron range and given that the damascene trenches often have very high aspect ratios, electroplated films must be exceedingly homogeneous (chemically and physically). They must have uniform thickness over the face of a wafer and must have consistent quality across numerous wafer batches.

Some wafer processing apparatus are designed to provide the necessary uniformity. One example is the clamshell apparatus available in the SABRE™ electroplating tool from Novellus Systems, Inc. of San Jose, Calif. and described in U.S. Pat. Nos. 6,156,167, 6,159,354 and 6,139,712, which are herein incorporated by reference in their entirety. The clamshell apparatus provides many advantages in addition to high wafer throughput and uniformity; such as wafer back-side protection from contamination during electroplating, wafer rotation during the electroplating process, and a relatively small footprint for wafer delivery to the electroplating bath (vertical immersion path).

There are many factors that can affect the quality of an electroplating process. Of particular note in the context of the present disclosure are problems having their genesis in the process of immersing the wafer into an electroplating bath. During wafer immersion into a plating electrolyte, bubbles can be entrapped on the plating underside of the wafer (the active side or plating surface). This is especially true when the wafer is immersed in a horizontal orientation (parallel to a plane defined by the surface of the electrolyte) along a vertical immersion trajectory.

Air bubbles trapped on the plating surface of a wafer can cause many problems. Bubbles shield a region of the plating surface of a wafer from exposure to electrolyte, and thus produce a region where plating does not occur. The resulting plating defect can manifest itself as a region of no plating or of reduced plating thickness, depending on the time at which the bubble became entrapped on the wafer and the length of time that it stayed entrapped there.

Another problem associated with vertical immersion of a horizontally oriented wafer is multiple wetting fronts. When a wafer is immersed in this way, the electrolyte contacts the wafer at more than one point, creating multiple wetting fronts as the wafer is submerged in the electrolyte. Where individual wetting fronts converge, bubbles may be trapped. Also, defects in the finished plating layer can be propagated from microscopic unwetted regions formed along convergence lines of multiple wetting fronts.

What is needed therefore is a way to improve plated metal quality. Improved methods and apparatus should reduce the problems that can arise from bubble formation and multiple wetting fronts during wafer immersion.

SUMMARY

Methods described herein manage wafer entry into an electrolyte so that air entrapment due to initial impact of the wafer and/or wafer holder is reduced and the wafer is moved in such a way that an electrolyte wetting wave front is maintained throughout immersion of the wafer also minimizing air entrapment, that is, the wave front does not collapse during propagation across the wafer plating surface.

One embodiment is a method of immersing a wafer into an electrolyte of a plating bath, the method including: (a) positioning the wafer horizontally at a first height above the electrolyte, wherein a planar plating surface of the wafer is parallel to a plane defined by the surface of the electrolyte; (b) tilting the wafer at an angle such that the planar plating surface of the wafer is no longer parallel to the plane defined by the surface of the electrolyte; and (c) moving the wafer into the electrolyte such that an electrolyte wetting wave front is maintained throughout immersion of the wafer.

One embodiment is a method of immersing a wafer into an electrolyte of a plating bath, the method including: (a) positioning the wafer horizontally at a first height above the electrolyte, wherein a planar plating surface of the wafer is parallel to a plane defined by the surface of the electrolyte; (b) tilting the wafer at an angle such that the planar plating surface of the wafer is no longer parallel to the plane defined by the surface of the electrolyte; (c) moving the wafer at a first speed toward the electrolyte along a trajectory substantially normal to the plane defined by the surface of the electrolyte; (d) decelerating from the first speed to a second speed, the leading edge of the wafer entering the electrolyte at the first speed or during the deceleration from the first speed to the second speed; (e) accelerating the wafer from the second speed to a third speed, wherein the acceleration is continued until a substantial portion of the planar plating surface of the wafer is immersed in the electrolyte; and (f) decelerating the wafer from the third speed to a stop at a second height; wherein the planar plating surface of the wafer is totally immersed in the electrolyte at the third speed or during the deceleration from the third speed to the stop. These speeds will also be referred to as translational wafer speeds or Z-speeds.

Methods described herein may include rotating the wafer along an axis normal to the planar plating surface of the wafer and which passes through the center of the wafer. In certain embodiments, the deceleration from the first speed to the second speed is continued until between about 25% and about 75% of the planar plating surface of the wafer is immersed in the electrolyte, in some embodiments until about 50% of the planar plating surface of the wafer is immersed in the electrolyte. The leading edge of the wafer may enter the electrolyte during acceleration to the first speed, at the first speed or during the deceleration from the first speed to the second speed. In one embodiment, the wafer is totally immersed in the electrolyte during deceleration from the third speed to the stop. In certain embodiments, the total time for immersion, from the time the leading edge of the wafer enters the electrolyte until the wafer is completely immersed in the electrolyte, is less than 300 milliseconds, in other embodiments, less than 200 milliseconds.

In one embodiment, the first speed is between about 120 mm/s and about 300 mm/s, such as between about 120 mm/s and 200 mm/s. In some embodiments, high speeds of between about 200-300 mm/s are used. In one embodiment, the second speed is between about 40 mm/s and about 80 mm/s. In one embodiment, the third speed is less than the first speed. In one embodiment, the third speed is between about 100 mm/s and about 140 mm/s. Other aspects of the first, second and third speeds are discussed in more detail below. In one embodiment, the wafer is tilted at an angle of 5 degrees or less (not including zero). Different rotational speeds may be employed during immersion and during electroplating. In certain embodiments, a rotational speed of between about 10 rpm and 180 rpm is used during immersion for a 200 mm wafer, between about 5 rpm and 180 rpm for a 300 mm wafer, and between about 5 rpm and 150 rpm for a 450 mm wafer.

Another embodiment is a method of immersing a wafer into an electrolyte of a plating bath, the method including: (a) positioning the wafer horizontally at a first height above the electrolyte, wherein a planar plating surface of the wafer is parallel to a plane defined by the surface of the electrolyte; (b) tilting the wafer at an angle of between about 1 degree and about 5 degrees such that the planar plating surface of the wafer is no longer parallel to the plane defined by the surface of the electrolyte; (c) rotating the wafer along an axis normal to the planar plating surface of the wafer and which passes through the center of the wafer; (d) moving the wafer at a first speed of between about 120 mm/s and about 300 mm/s toward the electrolyte along a trajectory substantially normal to the plane defined by the surface of the electrolyte; (e) decelerating the wafer to a second speed of between about 40 mm/s and about 80 mm/s, the leading edge of the wafer entering the electrolyte at the first speed or during the deceleration from the first speed to the second speed; and wherein between about 40% and about 60% of the planar plating surface is immersed during the deceleration from the first speed to the second speed; (f) accelerating the wafer from the second speed to a third speed of between about 100 mm/s and about 140 mm/s, wherein the acceleration is continued until at least about 75% of the planar plating surface of the wafer is immersed in the electrolyte; and (g) decelerating from the third speed to a stop at a second height; wherein the planar plating surface of the wafer is totally immersed in the electrolyte at the third speed or during the deceleration from the third speed to the stop. In one embodiment, the deceleration from the first speed to the second speed is continued until about 50% of the planar plating surface of the wafer is immersed in the electrolyte.

In some embodiments, any of the methods described herein is combined with active angle entry. In active angle entry the tilt angle of the wafer is changed during wafer immersion, such as to further minimize entrapment of air bubbles. In one implementation, the leading edge of the wafer contacts the electrolyte at a first angle, then the tilt angle is increased to a greater, second tilt angle, as the wafer is being immersed, followed by decrease in the tilt angle, typically to zero (parallel to electrolyte). The change in the tilt angle can occur during any of the first, second, or third Z-speed. In other embodiments of the active tilt control, the change in the tilt angle comprises a decrease of the tilt angle from the first angle, to a smaller angle, and then to zero.

In general, active tilt angle control can be advantageous not only in combination with Z-speed variation, but even when the Z-speed is changed in conventional way (acceleration to a constant speed followed by deceleration to a stop). In one aspect, a method of immersing the wafer includes contacting the leading edge of the wafer with an electroplating solution while the wafer is tilted at a first angle relative to horizontal, followed by increasing the tilt angle to a second angle, and finally followed by reducing the tilt angle, typically to zero. The first and second tilt angles, in some embodiments are between about 1-5 degrees.

In one embodiment a method of immersing a wafer into a plating solution includes: contacting a leading edge of the wafer, while the wafer is tilted with respect to the horizontal, with the plating solution at a first translational speed, followed by slowing the wafer to a second translational speed while the wafer is partially immersed in the plating solution; and then speeding the wafer to third speed before the wafer is fully immersed in the plating solution.

In some embodiments, the methods for wafer immersion include immersing the wafer at unusually high Z-speeds. In one embodiment, a method of immersing a wafer into a plating solution includes: contacting a leading edge of the wafer, while the wafer is tilted with respect to the horizontal, with a plating solution at a first translational speed of at least about 120 mm/s in a direction toward the plating solution. For example, in some embodiments, the first translational speed is between about 120 mm/s-300 mm/s, such as between about 140 mm/s-300 mm/s, and, in some cases is between about 200 mm/s-300 mm/s.

All methods described herein can be used in the context of photolithographic processing, which can be performed before or after electroplating. In one of the embodiments, any method described herein can further include the steps of applying photoresist to the wafer; exposing the photoresist to light; patterning the resist and transferring the pattern to the wafer; and selectively removing the photoresist from the wafer. In some embodiments the photoresist is applied and patterned prior to electroplating, and is removed after electroplating.

In another aspect, an electroplating apparatus is provided. The apparatus includes a wafer holder configured to tilt a wafer during immersion into a plating solution; a chamber for holding the plating solution and a controller configured or designed to perform any of the wafer immersion methods disclosed herein. For example, the controller may include program instructions to perform the steps of the described methods. In one embodiment the controller includes instructions to deliver a tilted wafer at a speed of at least about 120 mm/s, in a direction toward the plating solution, as the wafer enters the solution. In one embodiment the controller includes instructions to deliver a tilted wafer at variable speeds, in a direction toward the plating solution, as the wafer is immersed in the plating solution. In one embodiment the controller includes instructions for: (i) positioning the wafer horizontally at a first height above the electrolyte, wherein a planar plating surface of the wafer is parallel to a plane defined by the surface of the electrolyte; (ii) tilting the wafer at an angle such that the planar plating surface of the wafer is no longer parallel to the plane defined by the surface of the electrolyte; (iii) moving the wafer at a first speed toward the electrolyte along a trajectory substantially normal to the plane defined by the surface of the electrolyte; (iv) decelerating from the first speed to a second speed, the leading edge of the wafer entering the electrolyte at the first speed or during the deceleration from the first speed to the second speed; (v) accelerating the wafer from the second speed to a third speed, wherein the acceleration is continued until a substantial portion of the planar plating surface of the wafer is immersed in the electrolyte; and (vi) decelerating the wafer from the third speed to a stop at a second height; wherein the planar plating surface of the wafer is totally immersed in the electrolyte at the third speed or during the deceleration from the third speed to the stop. In one embodiment the controller includes program instructions for: (i) contacting a leading edge of the wafer, while the wafer is tilted to a first angle with respect to the horizontal, with the plating solution, followed by (ii) increasing the tilt of the wafer to a second angle; and then (iii) reducing the tilt angle of the wafer to 0 degrees.

In another aspect, a system which includes any of the plating apparatuses described herein and a stepper is provided.

In another aspect, a non-transitory computer machine-readable medium comprising program instructions for control of an electroplating apparatus is provided. It can include program instructions comprising code for performing the steps of any of the methods described herein. For example, in one embodiment program instructions include code for: (i) positioning the wafer horizontally at a first height above the electrolyte, wherein a planar plating surface of the wafer is parallel to a plane defined by the surface of the electrolyte; (ii) tilting the wafer at an angle such that the planar plating surface of the wafer is no longer parallel to the plane defined by the surface of the electrolyte; (iii) moving the wafer at a first speed toward the electrolyte along a trajectory substantially normal to the plane defined by the surface of the electrolyte; (iv) decelerating from the first speed to a second speed, the leading edge of the wafer entering the electrolyte at the first speed or during the deceleration from the first speed to the second speed; (v) accelerating the wafer from the second speed to a third speed, wherein the acceleration is continued until a substantial portion of the planar plating surface of the wafer is immersed in the electrolyte; and (vi) decelerating the wafer from the third speed to a stop at a second height; wherein the planar plating surface of the wafer is totally immersed in the electrolyte at the third speed or during the deceleration from the third speed to the stop.

In some embodiments the program instructions include code for: (i) contacting a leading edge of the wafer, while the wafer is tilted to a first angle with respect to the horizontal, with the plating solution, followed by (ii) increasing the tilt of the wafer to a second angle; and then (iii) reducing the tilt angle of the wafer to 0 degrees.

Although applicable to other substrates besides semiconductor wafers, and not limited to any particular size of substrate, if a wafer is used, certain parameters described herein are dependent upon the size of the wafer being immersed in the electrolyte. The methods described herein work with, for example, wafers of 200 mm, 300 mm and 450 mm diameter.

These and other features and advantages of the present invention will be described in more detail below with reference to the associated drawings.

BRIEF DESCRIPTION OF THE DRAWINGS

FIGS. 2A-2D are schematic illustrations of a wafer at various stages during an immersion process into an electrolyte.

DETAILED DESCRIPTION

Overview

Figure 1A:
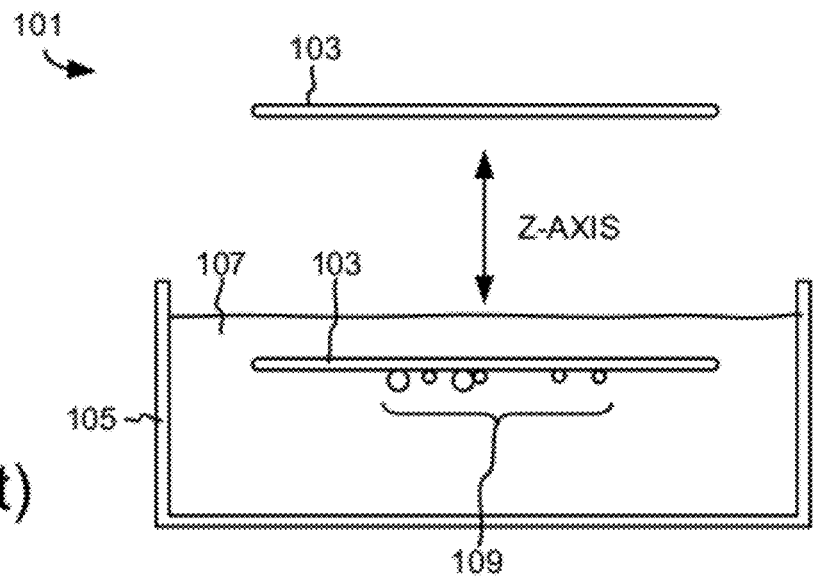
FIG. 1A is a cross-sectional diagram of a typical bubble-entrapment scenario.

As outlined in the Background section above, during wafer immersion into a plating electrolyte, bubbles can be entrapped on the plating underside of the wafer (the plating surface). This is especially true when the wafer is immersed in a horizontal orientation (parallel to a plane defined by the surface of the electrolyte) along a vertical immersion trajectory. Depicted in FIG. 1A is a cross-sectional diagram of a typical bubble-entrapment scenario arising in an electroplating system 101. A horizontally oriented wafer, 103, is lowered towards an electrolyte 107 in a vessel 105 along a vertical Z-axis and ultimately immersed in the electrolyte. Vertical immersion of a horizontally oriented wafer 103 results in air bubbles, 109, being trapped on the underside (plating surface) of wafer 103.

Air bubbles trapped on the plating surface of a wafer can cause many problems. Bubbles shield a region of the plating surface of a wafer from exposure to electrolyte, and thus produce a region where plating does not occur. The resulting plating defect can manifest itself as a region of no plating or of reduced thickness, depending on the time at which the bubble became entrapped on the wafer and the length of time that it stayed entrapped there. In an inverted (face down) configuration, buoyancy forces tend to pull bubbles upwards and onto the wafer's active surface. They are difficult to remove from the wafer surface because the plating cell has no intrinsic mechanism for driving the bubbles around the wafer edges, the only path off the wafer surface. Typically, wafer 103 is rotated about an axis that passes through its center and is perpendicular to its plating surface. This also helps to dislodge bubbles through centrifugal force, but many of the smaller bubbles are tenacious in their attachment to the wafer.

Also, this centrifugation does not address the aforementioned issues with multiple electrolyte wetting fronts forming defects on the wafer.

Therefore, while horizontal wafer orientation (especially coupled with a vertical immersion trajectory) has numerous advantages from a hardware configuration and throughput standpoint, it leads to technically challenging issues associated with gas entrapment and multiple wetting fronts and consequent defect formation.

Figure 1B:
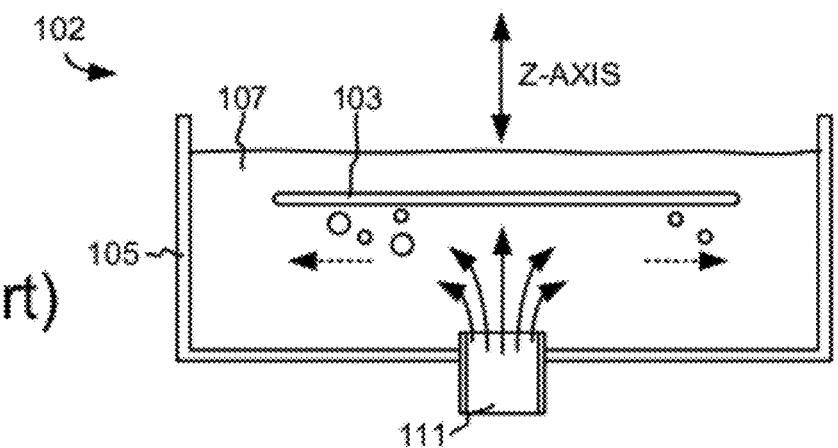
FIG. 1B is a cross-sectional diagram of a bubble removal scenario employing axially-directed electrolyte flow.

One way to facilitate removal of entrapped bubbles is to use a vertically directed electrolyte flow aimed at the plating surface of the wafer. This can help dislodge the bubbles. As depicted in FIG. 1B, scenario 102, plating solution is directed from a conduit, 111, normal to the plating surface of the wafer at a velocity sufficient to dislodge entrapped bubbles. As indicated by the arrows emanating from 111, the majority of the flow is directed at the center of wafer 103. As the flow encounters the surface of the wafer, it is deflected across the wafer surface to push the bubbles toward the sides of wafer 103 as indicated by the dashed arrows. This helps remove bubbles that are not only generated upon immersion, but also those formed or reaching the surface during electroplating. Unfortunately, the radial non-uniformity of the forced convection of such systems can result in non-uniform plating profiles. This is because the electroplating rate is a function of local fluid velocity, and the forced convection of the systems such as depicted in FIG. 1B introduces non-uniform velocity profiles across the wafer surface.

Figure 1C:
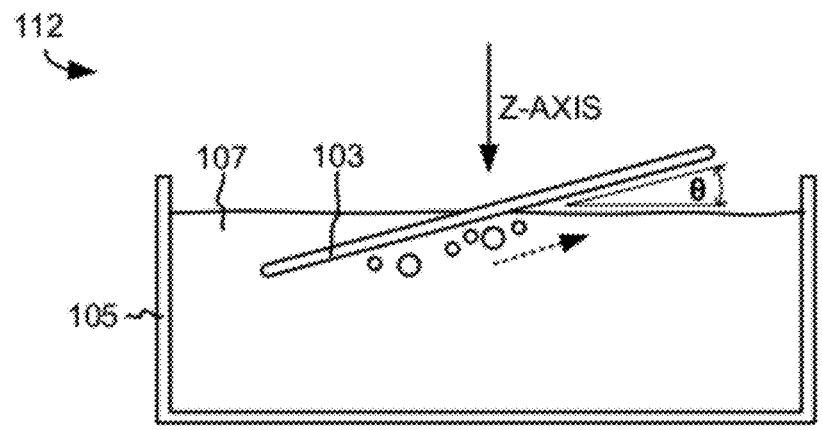
FIG. 1C is a cross-sectional diagram of a wafer having a tilted orientation (from a plane defined by the surface of an electrolyte) along a vertical immersion path (z-axis).

One way to address a number of the above-described issues is to use angled wafer immersion. That is, where the wafer is tilted relative to a plane defined by the surface of the electrolyte, while being introduced into the electrolyte along a vertical path (along a Z-axis). FIG. 1C depicts such an immersion scenario, 112, where wafer 103 is immersed in electrolyte 107 along a Z-axis, while the wafer is also tilted relative to the surface of the electrolyte, in this example, at an angle, $\theta$. Using angled immersion, bubbles that would otherwise be trapped on the wafer surface are, aided by buoyancy, no longer trapped but can escape to the atmosphere since the wafer is tilted. Also, a single wetting front is established, so there are no issues with convergent wetting fronts. Angled wafer immersion is described in more detail in U.S. Pat. No. 6,551,487, filed May 31, 2001, by Jonathan Reid et al., and entitled, "Methods and Apparatus for Controlled-Angle Wafer Immersion," which is incorporated by reference herein in its entirety. Rotation speed may complement angled immersion to reduce bubble formation.

Figure 1D:
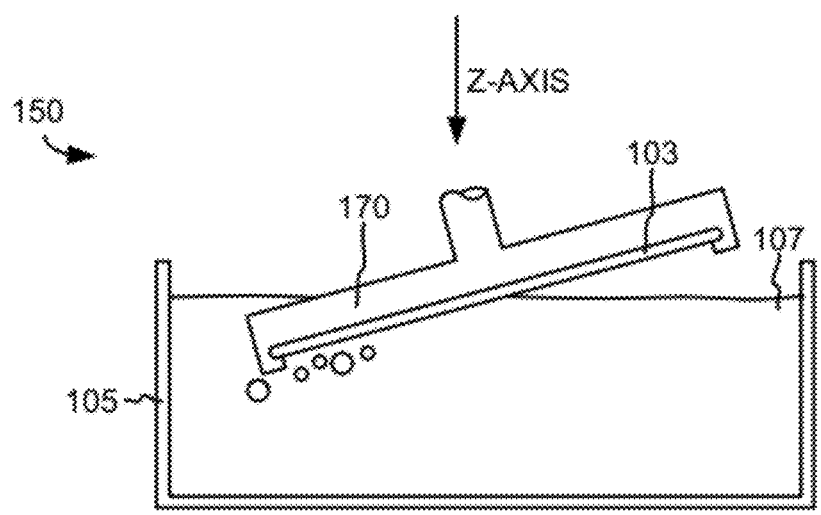
FIG. 1D is a cross-sectional diagram of a wafer having a tilted orientation (from a plane defined by the surface of an electrolyte) along a vertical immersion path (z-axis) including a wafer holder.

Another problem is that a typical wafer holder has some mechanism and associated hardware for holding the wafer, typically along the periphery of the wafer, as well as positioning and rotating the wafer. As depicted cross sectional diagram 150 in FIG. 1D, when a vertical immersion path is used, the components of wafer holder, 170, particularly the leading edge, come into contact with the electrolyte prior to the wafer itself because there is at least some portion of the wafer holder that exists beyond the circumference of the wafer and overhangs the wafer plating surface. When this leading edge of the wafer holder impacts the electrolyte, air bubbles are trapped due to the geometry of that portion of the wafer holder around the circumference of the wafer and extending past the plating surface. Certain wafer holders, for example the Clamshell apparatus described above, are shaped and configured to minimize this issue, but still the problem exists at least to some extent.

Sonication can be used to aid in breaking up bubbles, as described in U.S. Pat. No. 7,727,863, entitled, "Sonic Irradiation During Wafer Immersion" by Bryan Buckalew et al., which is incorporated by reference in its entirety herein. In one embodiment, sonication, for example as described in U.S. Pat. No. 7,727,863, is used in conjunction with methods described herein. In one embodiment, sonication is used at least during the first 50 ms (millisecond) after impact of the wafer with the electrolyte. In one embodiment, sonication is used at least during the first 100 ms after impact of the wafer with the electrolyte. In one embodiment, sonication is used at least during the first 150 ms after impact of the wafer with the electrolyte. In one embodiment, sonication is used during immersion of the entire wafer in the electrolyte.

Still, as plating regimes become further and further refined, for example requiring ever thinner and ever higher quality plated layers, air entrapment can be an issue even with, for example, angled wafer immersion. For example, using conventional immersion processes, as the tilted wafer holder loaded with a wafer enters the plating solution, at least some air entrapment occurs as a result of the poor displacement of air underneath the wafer. Incomplete initial wetting of the wafer due to air entrapment on the wafer surface at wafer entry results into poor adsorption of plating additive molecules on the wafer surface. Lack of uniform additive adsorption and poor wetting characteristics cause poor filling behavior, pitting or missing metal defects on the surface of the wafer. The inventors have found that novel immersion processes lead to reduced defectivity in the wafer's plated layer by further reducing the amount of air entrapment, for example, as compared to angled immersion used in combination with conventional immersion methods.

FIGS. 2A-2D depict perspective diagrams outlining parameters discussed in relation to the immersion methods described herein. FIG. 2A shows that, depending on the apparatus used, a wafer, 240, must travel a linear distance, 246, before entering a plating electrolyte, 244, in a plating bath, 242. FIG. 2B shows that wafer 240 is tilted from the horizontal (parallel to the electrolyte surface) at an angle. It has been found that a desirable angle is between about 1 degree and about 5 degrees, in certain embodiments between about 3 degrees and about 5 degrees. These ranges allow for the benefits of angled immersion as discussed, while keeping the footprint of the apparatus at a minimum. The wafer may be tilted at any time along its vertical trajectory to the electrolyte, so long as it is titled upon entry into the electrolyte. A leading edge of the wafer entering the electrolyte creates a single wetting front rather than multiple wetting fronts when the wafer is introduced horizontally. In certain embodiments, the angle the wafer is tilted is changed during the immersion protocol. In these embodiments, the "swing speed," that is, the speed that the wafer is tilted from horizontal to $\theta$ may be controlled so as not to create turbulence and thus introduce unwanted air entrapment. As with all events in a high throughput environment, if the swing speed is too slow, throughput suffers, if swing speed is too fast turbulence may be the result. In one embodiment, the swing speed of the wafer is between about 0.25 and 10 degrees per second. In another embodiment, the swing speed is between about 0.25 and 1.5 degrees per second. In yet another embodiment, the swing speed is between about 0.5 and 1 degrees per second.

In one embodiment, the tilt angle is established prior to immersion and held constant during the immersion process. Methods described herein include steps of positioning a wafer horizontally above an electrolyte and tilted the wafer from horizontal; these steps can be performed in any order so long as the wafer is tilted upon entry into the electrolyte. Tilting the wafer may be performed while the wafer moves along its Z-axis trajectory or prior to movement along the Z-axis.

In some embodiments, the tilt angle is actively changed during immersion of the wafer. This can result in reduced entrapment of bubbles. Active tilt angle control can be used independently of Z-speed variation, or in combination with Z-speed variation for reduced air bubble entrapment. In some embodiments, the leading edge of the wafer contacts the plating solution, while the wafer is tilted at a first angle to the horizontal; then the tilt of the wafer is increased to a second angle, followed by decrease to, for example, zero degree angle. In other embodiments the leading edge of the wafer contacts the plating solution while the wafer is tilted at a first angle to horizontal, then the tilt angle is decreased to a smaller tilt angle, before finally decreasing the tilt angle to zero degrees.

FIG. 2C depicts that the wafer may also be rotated during immersion. Like tilting, wafer rotation may be implemented any time along the wafer's vertical trajectory to the electrolyte, so long as it is rotating upon entry into the electrolyte. FIG. 2D depicts wafer 240, tilted and rotating, as it is being immersed in electrolyte 244. For immersing the wafer, in one embodiment, the rotational speed is between about 10 rpm and 180 rpm for a 200 mm diameter wafer, about 5 rpm and 180 rpm for a 300 mm wafer, and about 5 rpm and about 150 rpm for a 450 mm wafer. Different rotation speeds may be used for immersion (a first rotational speed) vs. plating (a second rotational speed) and also post plating (further plating speeds). For example the wafer may be spun at particular speeds to recover electrolyte from the wafer after removing it from the bath, and, for example, when rinsing the electrolyte from the plated wafer. These, along with exemplary hardware for carrying out angled immersion methods is described in more detail in U.S. Pat. No. 6,551,487 (cited above).

Figure 3:
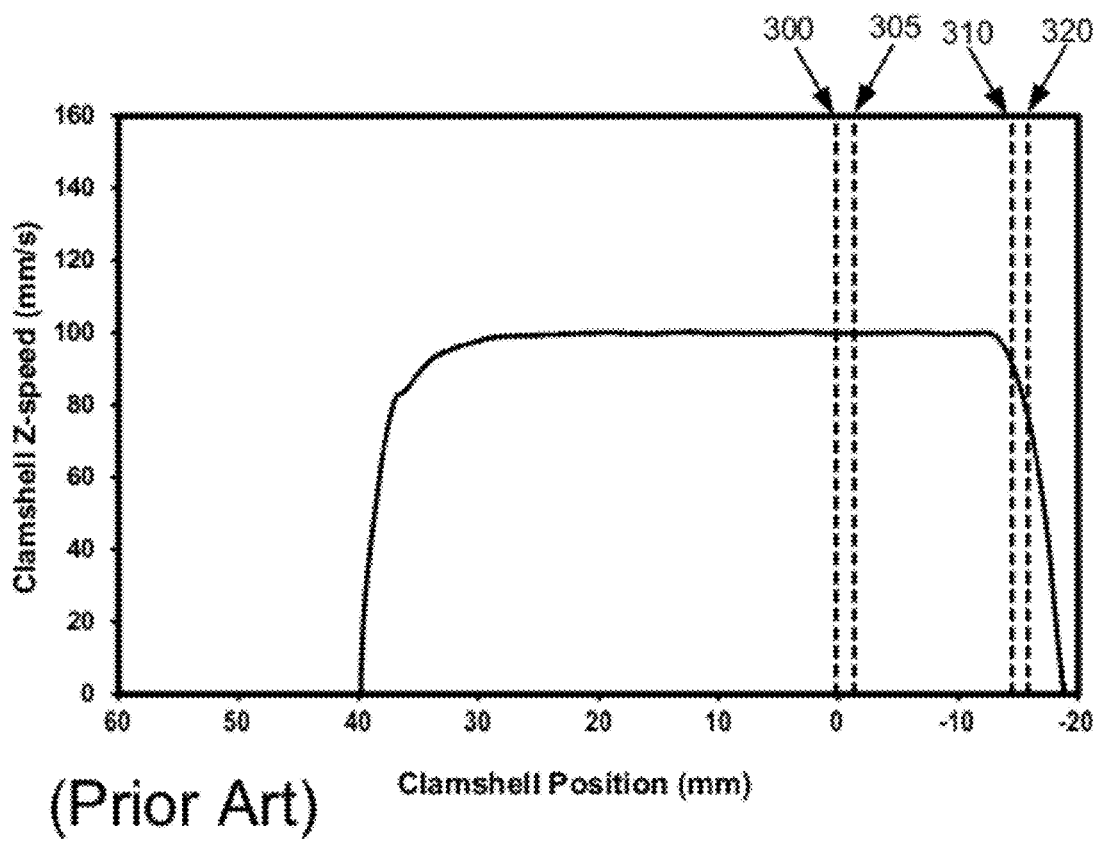
FIG. 3 is a graph of a conventional trapezoidal immersion Z-speed profile.

FIG. 3 is a graph of a conventional angled immersion protocol, where the vertical trajectory speed, "Z-speed," is the y-axis and the wafer holder position is represented along the x-axis. On the x-axis, the wafer holder position is reported as relative to the electrolyte surface, where positive distances (in millimeters) are positions above the electrolyte, 0 is the electrolyte surface, and negative distances are positions below the surface of the electrolyte. This profile reflects wafer immersion using a Clamshell wafer holder that has some associated hardware along the periphery of the wafer that comes into contact with the electrolyte prior to the wafer itself.

In the immersion protocol in FIG. 3, assuming the wafer is already tilted from horizontal and held at that angle during immersion, the wafer is moved toward the electrolyte, along the Z-axis, from a resting position above the electrolyte. In this example, the wafer is also rotated during immersion. The wafer holder starts from entry position above the surface of the plating solution and is accelerated to a constant Z-speed, for example, in the range of 70-110 mm/s while it is above the surface of the electrolyte and moving toward the electrolyte. The wafer impacts the solution with this Z-speed, and the Z-speed stays constant during most of the wafer immersion up to about 4-7 mm above the final (plating) position where the wafer holder starts to decelerate and comes to stop at plate position. Such immersion Z-speed profiles take the approximate shape of a trapezoid, and are sometimes called "trapezoidal" Z-speed curves.

In the example of FIG. 3, the leading edge wafer holder starts at 40 mm from the electrolyte surface. The wafer is accelerated toward the electrolyte along the Z-axis until it reaches a speed of about 100 mm/s at a distance of about 30 mm from the electrolyte surface. The Z-speed then stays constant at about 100 mm/s until the leading edge of the wafer holder touches the electrolyte (0 on the x-axis, indicated by dotted line 300). Shortly thereafter, the leading edge of the wafer itself touches the electrolyte (at about −2 mm on the x-axis, indicated by dotted line 305). At about −10 mm on the x-axis, about half the wafer is immersed in the electrolyte. At about −15 mm on the x-axis, the wafer is completely immersed in the electrolyte (indicated by dotted line 310). Just prior to this point, the Z-speed is decelerated from the 100 mm/s used during most of the immersion. The following edge of the wafer holder is completely immersed at about −16 mm (indicated by dotted line 320). The deceleration is continued until the leading edge of the wafer holder is about 18 mm below the surface of the electrolyte (−18 mm on the x-axis); this is a typical plating depth.

Figure 4:
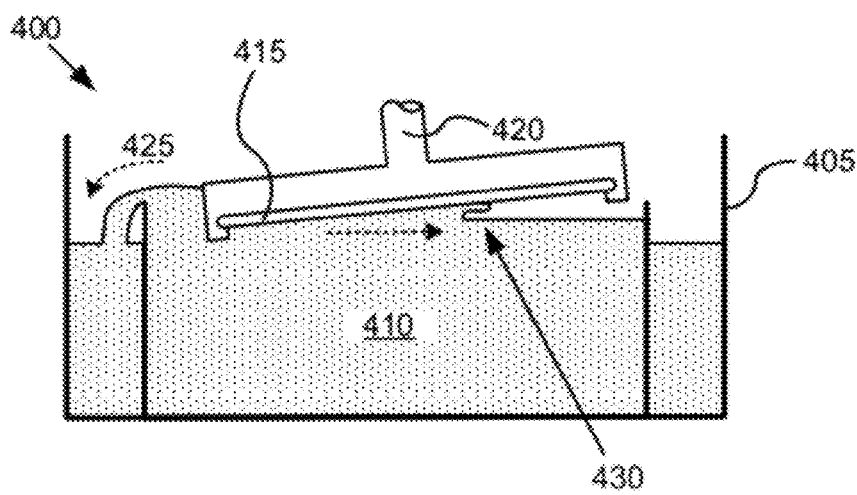
FIG. 4 is a cross sectional diagram of angled wafer immersion using a trapezoidal Z-speed profile.

There are some associated problems with trapezoidal Z-speed immersion protocols. FIG. 4 shows a cross sectional diagram of a wafer immersion process, 400, which uses a trapezoidal Z-speed profile. A wafer holder, 420, holds a wafer, 415. Wafer 415 is rotated and immersed into an electrolyte, 410, held in a plating bath, 405, along a Z-axis trajectory as described in relation to FIG. 3. This diagram represents a snapshot in time, where the wafer is about half immersed in the electrolyte. The associated problems can be bifurcated into two main issues.

The first issue is that the Z-speed at which the wafer impacts the solution does not ensure sufficient removal of the trapped air at the wafer edge that can cause incomplete wetting at the leading side of the wafer resulting (ultimately) in pit defects. The impact of the wafer holder on the surface of the electrolyte results into shearing and normal (to the electrolyte surface) stress buildup on the air pocket trapped at the wafer edge. Also, portions of the wafer holder that extend past the circumference of the wafer and, for example, past the wafer plating surface in the Z-direction may enhance air entrapment. The impact with the electrolyte surface causes the pressure in the air pocket to increase significantly. If the impact speed is not sufficient, the air pocket can either remain in place or breakup into smaller air pockets causing poor wetting of the wafer surface. It has been found that a minimum Z-speed in the range of about 120 mm/s to about 300 mm/s is needed at impact to cause enough pressure buildup to purge the air pocket. As depicted in FIG. 4, when the wafer holder impacts the electrolyte surface, displaced electrolyte, e.g., spills over a weir (as indicated by 425) in plating cell 405, while the electrolyte under the wafer plating surface forms a wetting wave front that propagates along the surface of the wafer as depicted by the horizontal dotted arrow in FIG. 4. The wetting wave front's leading edge, 430, is also depicted in FIG. 4.

The second issue with the current trapezoidal profile is the formation and ultimate breakup of the solitary wetting wave front as it traverses along the interface between the surface of the electrolyte and the wafer plating surface. This is analogous to a wave on a beach reaching a crest and then crashing down (collapsing) on the surf due to loss of energy sufficient to continue propagating the wave. This wave collapse results in large amounts of bubble formation in the electrolyte, bubbles that in turn adhere to the wafer surface resulting in voids and missing metal defects. Thus, the constant Z-speed through most of the wafer immersion in the trapezoidal profile invariably causes wave buildup in a first period of the wafer immersion and wave collapse in the latter portion of immersion.

While not wishing to be bound by theory, it is believed that the wetting wave front tends to breakup when the wave speed does not closely match the speed of the underlying bulk solution on which it propagates. The wave collapses when the difference between wave and bulk solution speed is larger than a cutoff value depending on the liquid property and geometry of the cell containing the plating solution. Thus, it was discovered that a variable speed wafer entry profile during wafer immersion was needed to control the wave formation and propagation to prevent the wave front from collapsing.

Methods

Described herein are methods of immersing a wafer into an electrolyte of a plating bath. Generally, methods described herein include positioning the wafer horizontally at a first height above the electrolyte, wherein a planar plating surface of the wafer is parallel to a plane defined by the surface of the electrolyte; (b) tilting the wafer at an angle such that the planar plating surface of the wafer is no longer parallel to the plane defined by the surface of the electrolyte; and (c) moving the wafer into the electrolyte such that an electrolyte wetting wave front is maintained throughout immersion of the wafer. In one embodiment, the wafer is titled at an angle of 5 degrees or less. In one embodiment, the wafer is tilted at an angle of between about 1 degree and about 5 degrees. In one embodiment, the wafer is tilted at an angle of between about 3 degrees and 5 degrees. In more specific embodiments, methods include introducing the wafer into the electrolyte at a speed (accelerating, constant or decelerating) sufficient to minimize entrapment of air on the wafer surface near the leading edge that enters the electrolyte. The wafer Z-speed is decelerated at a rate sufficient to maintain the wetting wave front, that is, to keep the wave from collapsing during immersion. After a first portion of the wafer is immersed the deceleration is ceased at a second speed, acceleration is implemented again, in order to keep the wave front from collapsing. The acceleration is maintained to a third speed and again deceleration to a stop is used on the final portion of the Z-speed profile. The final deceleration is used to minimize bubble formation as the latter portion of the wafer is immersed, as a progressively smaller area of the wafer is being immersed and thus the wetting wave front is more controlled as it propagates across this progressively smaller area toward full immersion. The wafer is fully immersed at some point between reaching the third speed and during the deceleration to stop.

Figure 5A:
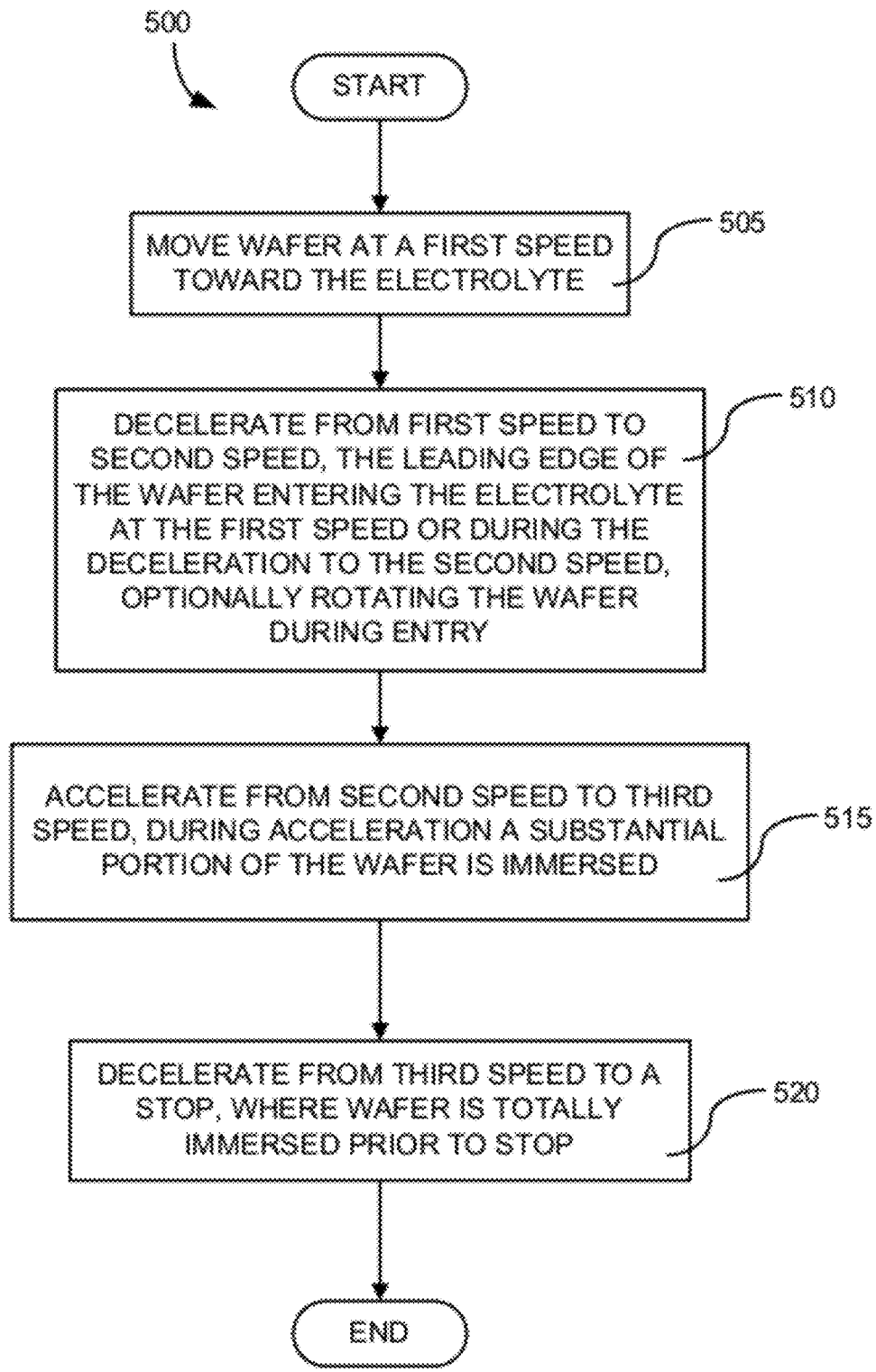
FIG. 5A is a process flow describing aspects of a method as described herein, in accordance with one embodiment.

FIG. 5A describes aspects of a method, 500, for carrying out such an immersion. Assuming the wafer is positioned appropriately above the electrolyte and the wafer is tilted prior to entry into the electrolyte, the wafer is moved at a first speed toward the electrolyte along a Z-axis trajectory, see 505. The wafer may also be rotated as described herein. Once the first (Z) speed is reached, the wafer is then decelerated from the first speed to a second (Z) speed, see 510. The leading edge of the wafer enters the electrolyte at the first speed or during the deceleration to the second speed, while the wafer is optionally rotated during entry. In one embodiment, the first speed is between about 120 mm/s and about 300 mm/s, in another embodiment, between about 120 mm/s and about 175 mm/s, in yet another embodiment, between about 120 mm/s and about 160 mm/s. In some embodiments high speeds of between about 200-300 mm/s are used. In one embodiment, when the wafer enters the electrolyte at the first speed, the Z-speed is held constant for between about 10 ms and about 80 ms starting when the leading edge of the wafer makes contact with the surface of the electrolyte, in one embodiment, the first speed is held for about 50 ms prior to the deceleration to the second speed. In one embodiment, the wafer's leading edge enters the electrolyte during the deceleration from the first speed to the second speed. In one embodiment, the second speed is between about 40 mm/s and about 110 mm/s, in another embodiment, between about 50 mm/s and about 70 mm/s, in yet another embodiment, between about 55 mm/s and about 65 mm/s. Upon entry of the leading edge of the wafer into the electrolyte a first portion of the wafer is immersed. In one embodiment, the deceleration from the first speed to the second speed is continued until between about one 25% and about 75% of the planar plating surface of the wafer is immersed in the electrolyte, in another embodiment the deceleration is continued until about 50% of the wafer plating surface is immersed.

After the second speed is reached, there may be a period of time in which the Z-speed is held at the second speed. In one embodiment the second Z-speed is held constant for between about 50 ms and about 120 ms, in one embodiment about 100 ms. In one embodiment, there is no hold at the second speed, that is, once the second speed is reached, the Z-speed is accelerated to a third speed, see 515. In one embodiment, the third speed is less than the first speed. In one embodiment, the third speed is between about 100 mm/s and about 140 mm/s, in another embodiment, between about 120 mm/s and about 140 mm/s, in another embodiment, between about 130 mm/s and about 140 mm/s.

In one embodiment, during the acceleration from the second speed to the third speed, a substantial portion of the wafer is immersed in the electrolyte. For the purposes of this disclosure, a "substantial portion" of the wafer means a total area of the wafer plating surface that includes the aforementioned first portion that is immersed during the deceleration from the first speed to the second speed, and a second portion of the wafer surface immersed during the acceleration from the second speed to the third speed, up to and including between about 75% and about 95% of the wafer plating surface. After the third (Z) speed is reached, the Z-speed is decelerated from the third speed to stop, see 520. The planar plating surface of the wafer is totally immersed in the electrolyte at the third speed or during the deceleration from the third speed to the stop. In one embodiment, the planar plating surface of the wafer is totally immersed in the electrolyte during the deceleration from the third speed to the stop. After the wafer is completely immersed in the electrolyte, method 500 is done. In certain embodiments, the wafer is immersed to a depth of between about 15 mm and about 35 mm during plating, in another embodiment, between about 15 mm and about 20 mm, in another embodiment, between about 16 mm and about 18 mm. As mentioned, the rotational speed of the wafer can optionally be changed from that used during immersion to a more suitable rate for electroplating.

The total time for immersion can be important, for example, because during immersion one portion of the wafer is exposed to the electrolyte and another portion is not. Depending on the plating conditions, the thickness of a seed layer, etc., it may be important to immerse the wafer as quickly as possible. This must be balanced with the need to reduce air entrapment. In one embodiment, the total time for the immersion, from the time the leading edge of the wafer enters the electrolyte until the wafer is completely immersed in the electrolyte, is less than 300 milliseconds, in another embodiment, less than 250 milliseconds, in yet another embodiment, less than 200 milliseconds. In one embodiment, the acceleration and deceleration rates are comparable. In one embodiment, the range of acceleration and deceleration rates are, each independent of the other, between about 0.1 m/s$^2$ and about 7.5 m/s$^2$, in another embodiment, between about 1.5 m/s$^2$ and about 6 m/s$^2$, in yet another embodiment, between about 2.5 m/s$^2$ and about 4 m/s$^2$.

Figure 5B:
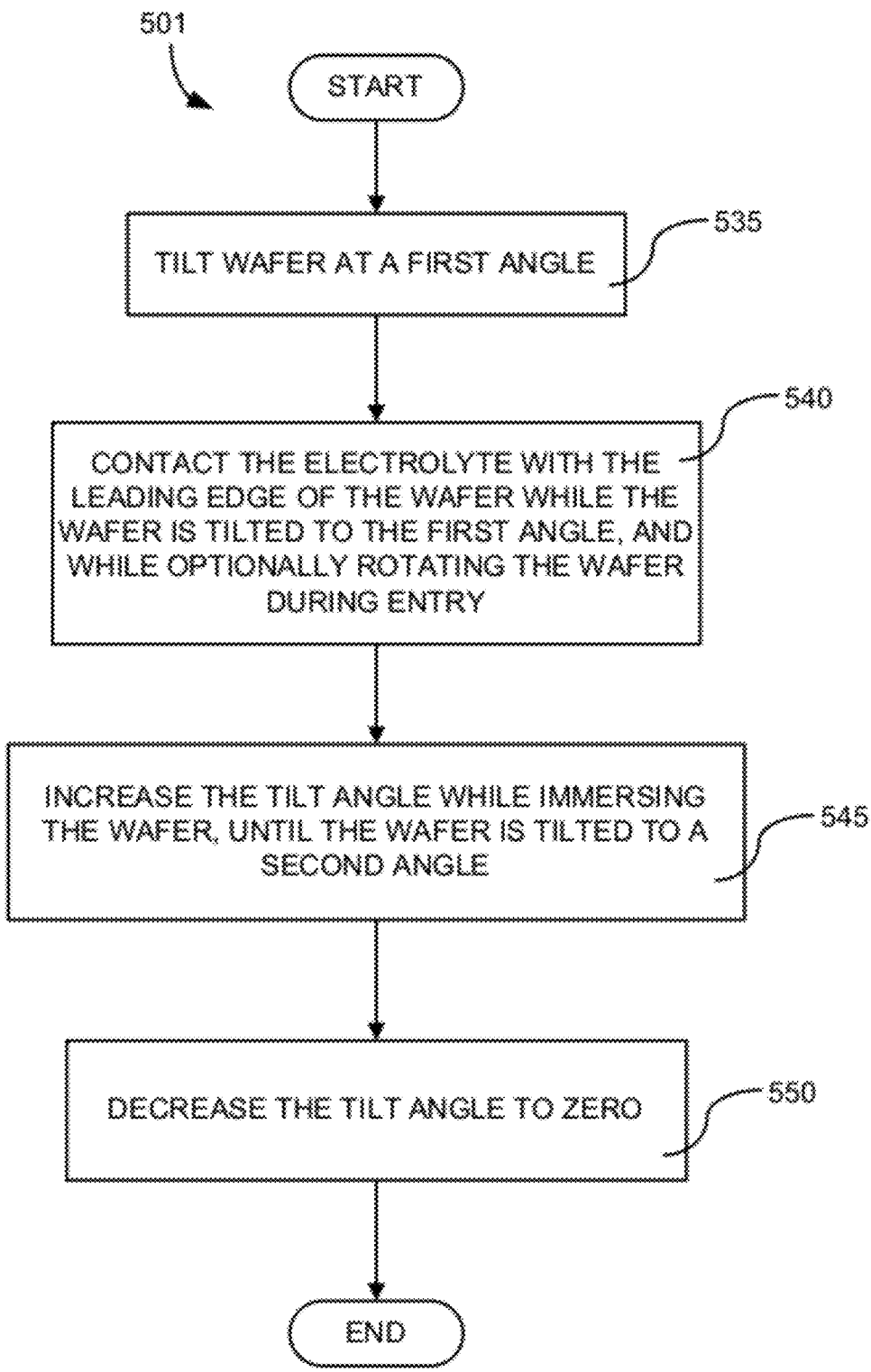
FIG. 5B is a process flow describing aspects of a method as described herein, in accordance with another embodiment.

FIG. 5B describes a process flow 501 for one embodiment of an immersion protocol, which uses active tilt angle control to reduce air bubble entrapment. This protocol can be combined with the process depicted in FIG. 5A, and can also be used independently, e.g., with conventional Z-speed profiles. In the embodiment depicted in FIG. 5B, the process starts in 535 by tilting the wafer at a first angle, and contacting the plating solution with the leading edge of the wafer while the wafer is tilted at a first angle in operation 540, and while optionally rotating the wafer. Next the tilt angle is increased to a second angle while the wafer is being immersed in operation 545, before reducing the tilt angle, typically to zero degrees as shown in operation 550. As it has been mentioned, this sequence can be combined with the process sequence depicted in FIG. 5A. For example, the increase in the tilt angle can occur at any of the first, second or third Z-speeds. The tilt angle, in some embodiments, is between about 1-5 degrees before the tilt angle is decreased to zero. In one specific illustrative example, the wafer is first tilted to 1.4 degrees, and the leading edge of the wafer contacts the plating solution while the wafer is tilted to 1.4 degrees. During this time the Z-speed may be the first speed, or the wafer may be decelerated to the second speed. Next the tilt is increased to 4 degrees, and the Z-speed may be accelerated to a third speed. And finally, the wafer tilt is decreased to zero and the wafer is brought to horizontal orientation. In other embodiments, the process depicted in FIG. 5B is used with conventional trapezoidal Z-speed profile. In such embodiments, it has been shown to decrease bubble entrapment. In some embodiments, the tilt angle of the wafer is decreased to a smaller tilt angle (non zero tilt) after the wafer contacts the electroplating solution at a first angle, and before eventually decreasing the tilt angle to zero degrees.

Figure 6:
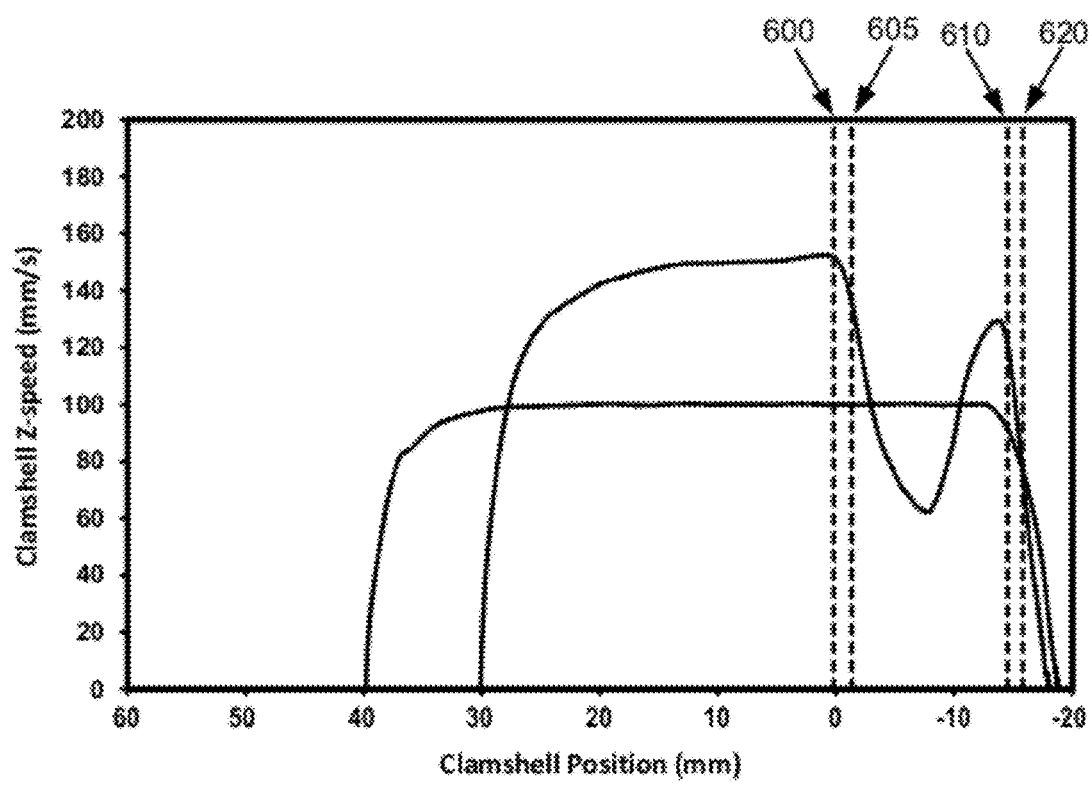
FIG. 6 is a graph of an immersion method as described herein.

FIG. 6 is a graph of an immersion method as described in the process depicted in FIG. 5A. As in FIG. 3, the y-axis depicts wafer holder Z-speed, and the x-axis depicts wafer holder position relative to the electrolyte surface. A Clamshell wafer holder was also used in this example. The conventional trapezoidal Z-speed profile described in relation to FIG. 3 is superimposed onto FIG. 6 for comparison. In this example, assuming the wafer is tilted at an angle as described, the leading edge of the (Clamshell) wafer holder starts at a position that is about 30 mm from the electrolyte surface. The wafer is moved toward the electrolyte along the Z-axis, accelerating to about 150 mm/s. At this first speed, the wafer holder contacts the electrolyte (indicated by dotted line 600) surface and a deceleration from the first speed to a second speed, in this example about 60 mm/s, commences. The wafer's leading edge touches the electrolyte at about −2 mm (indicated by dotted line 605). In this example, during the first deceleration phase, about half of the wafer is immersed. In one embodiment, about half of the wafer is immersed concurrent with the point in time when the second speed is reached. Once the second speed is reached, the wafer's Z-speed is once again accelerated from the second speed to a third speed, in this example about 130 mm/s. During this acceleration phase, all but a small portion of the remaining non-immersed portion of the wafer is immersed. Upon reaching the third speed, a deceleration phase is commenced and, at about that time, the wafer plating surface is completely immersed while a small portion of the wafer holder remains to be immersed (indicated by dotted line 610). During this final deceleration from the third speed to stop, the final portion of the wafer holder is immersed (indicated by dotted line 620). The Z-motion is continued until the wafer reaches a desired plating depth, in this example about 18 mm below the electrolyte surface (−18 mm on the graph).

Figure 7:
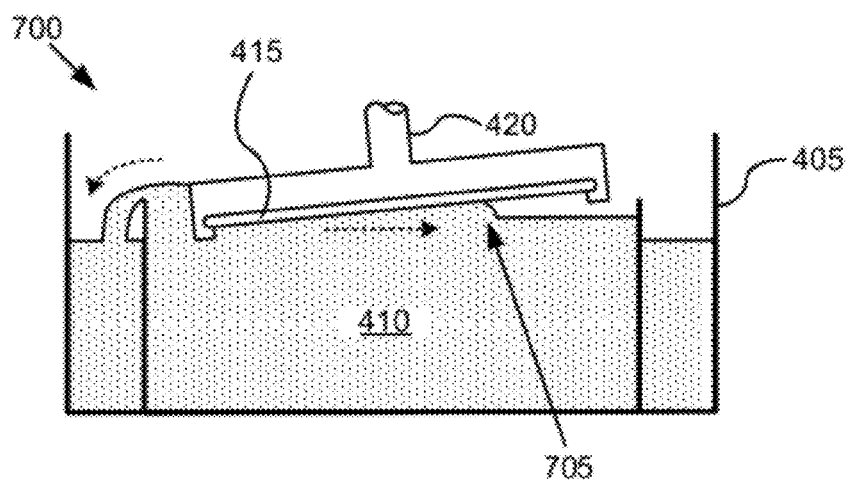
FIG. 7 is a cross sectional diagram of angled immersion using an immersion method as described herein.

FIG. 7 is a cross sectional diagram of angled immersion using an immersion method as described herein. FIG. 7 is analogous to FIG. 4, however, in FIG. 7, the immersion, 700, depicted employs the inventive Z-speed profiles as described herein. In this depiction, the electrolyte wetting wave front, 705, is stable and does not collapse as with conventional immersion methods.

One embodiment is a method of immersing a wafer into an electrolyte of a plating bath, the method including: (a) positioning the wafer horizontally at a first height above the electrolyte, wherein a planar plating surface of the wafer is parallel to a plane defined by the surface of the electrolyte; (b) tilting the wafer at an angle of between about 1 degree and about 5 degrees such that the planar plating surface of the wafer is no longer parallel to the plane defined by the surface of the electrolyte; (c) rotating the wafer along an axis normal to the planar plating surface of the wafer and which passes through the center of the wafer; (d) moving the wafer at a first speed of between about 120 mm/s and about 300 mm/s toward the electrolyte along a trajectory substantially normal to the plane defined by the surface of the electrolyte; (e) decelerating the wafer to a second speed of between about 40 mm/s and about 80 mm/s, the leading edge of the wafer entering the electrolyte at the first speed or during the deceleration from the first speed to the second speed; and wherein between about 40% and about 60% of the planar plating surface is immersed during the deceleration from the first speed to the second speed; (f) accelerating the wafer from the second speed to a third speed of between about 100 mm/s and about 140 mm/s, wherein the acceleration is continued until at least about 75% of the planar plating surface of the wafer is immersed in the electrolyte; and (g) decelerating from the third speed to a stop at a second height; wherein the planar plating surface of the wafer is totally immersed in the electrolyte at the third speed or during the deceleration from the third speed to the stop. In one embodiment, the deceleration from the first speed to the second speed is continued until about 50% of the planar plating surface of the wafer is immersed in the electrolyte. In one embodiment, the leading edge of the wafer enters the electrolyte during the deceleration to the second speed. In another embodiment, the third speed is less than the first speed. In one embodiment, (c) includes a rotational speed of between about 10 rpm and 180 rpm for a 200 mm wafer, between about 5 rpm and 180 rpm for a 300 mm wafer, and between about 5 rpm and 150 rpm for a 450 mm wafer. In one embodiment, is totally immersed in the electrolyte during deceleration from the third speed to the stop. In one embodiment, the total time for immersion, from the time the leading edge of the wafer enters the electrolyte until the wafer is completely immersed in the electrolyte, is less than 300 milliseconds.

One embodiment is a method of immersing a wafer into a plating solution, the method including: (a) contacting a leading edge of the wafer, while the wafer is tilted with respect to the horizontal, with the plating solution at a first translational speed, followed by; (b) slowing the wafer to a second translational speed while the wafer is partially immersed in the plating solution; and then (c) speeding the wafer to third speed before the wafer is fully immersed in the plating solution.

Another embodiment is a method of immersing a wafer into a plating solution, the method including: contacting a leading edge of the wafer, while the wafer is tilted with respect to the horizontal, with a plating solution at a first translational speed of at least about 120 mm/s in a direction toward the plating solution.

Methods described herein manage wafer entry into an electrolyte so that air entrapment due to initial impact of the wafer and/or wafer holder is reduced and the wafer is moved in such a way that an electrolyte wetting wave front is maintained throughout immersion of the wafer also minimizing air entrapment, that is, the wave front does not collapse during propagation across the wafer plating surface.

Apparatus

Another aspect of the invention is an apparatus configured to accomplish the methods described herein. A suitable apparatus includes hardware for accomplishing the process operations and a system controller having instructions for controlling process operations in accordance with the present invention.

Suitable apparatus for performing the methods described herein should provide wafer movement at speeds, angles, rotations, swing speed, accelerations and decelerations appropriate for the embodiments described. Preferably, rotational drive components of such apparatus can provide a wide range of rotational speeds for the wafer holder and Z-speeds, constant or not, in order to immerse a wafer within 300 milliseconds, at the described tilt angles, from the time the wafer's leading edge meets the electrolyte until the wafer is totally immersed. In one embodiment, the wafer holder's rotation mechanism can rotate a wafer at a speed of between about 1 rpm and about 600 rpm. In one embodiment, an actuator for moving the wafer holder along the Z-axis provides linear bi-directional movement at a speed of between 0 and about 300 millimeters/second. The wafer holder must also be able to tilt the wafer as described. Although other wafer holder components can be used to implement methods described herein, a good example of a wafer holder is the clamshell apparatus as described in U.S. Pat. Nos. 6,156,167 and 6,139,712. If a clamshell is used as the wafer holder component of the apparatus, the other components include positioning elements for the clamshell, since the clamshell has necessary electrical contacts, holding and rotational components, and the like.

One embodiment is a plating apparatus including: (a) a wafer holder configured to tilt a wafer from horizontal during immersion into a plating solution; (b) a chamber for holding said plating solution; and (c) a controller configured or designed to deliver a tilted wafer at a speed of at least about 120 mm/s, in a direction toward the plating solution, as the wafer enters the solution. In one embodiment, the wafer speed is between about 140 mm/s and 300 mm/s. In one embodiment, the wafer speed is at least about 120 mm/s when the wafer leading edge contacts the plating solution. The wafer holder can be, for example, a Clamshell wafer holder from Novellus Systems, Inc. of San Jose, Calif. The controller can be, for example, a commercially available controller modified to suit the needs of the methods described herein. One example of such controllers are those sold by IAI America, Inc. of Torrance, Calif.

One embodiment is a plating apparatus including: (a) a wafer holder configured to tilt a wafer from horizontal during immersion into a plating solution; (b) a chamber for holding said plating solution; and, (c) a controller configured or designed to deliver a tilted wafer at variable speeds, in a direction toward the plating solution, as the wafer is immersed in the solution. In one embodiment, the controller is designed or configured such that the tilted wafer leading edge initially contacts the plating solution at a first speed, and then the wafer slows to a second speed while it is partially immersed in the plating solution, and finally the wafer speeds to third speed before the wafer is fully immersed.

One embodiment is a plating apparatus including: (a) a wafer holder configured to tilt a wafer from horizontal during immersion into a plating solution; (b) a chamber for holding said plating solution; and, (c) a controller having program instructions for tilting the wafer at a first angle, followed by contacting the leading edge of the wafer with the plating solution, while the wafer is tilted at the first angle; increasing the tilt angle to the second angle, and, then reducing the tilt angle to zero.

Embodiments of the present invention may employ various processes involving data stored in or transferred through one or more computer systems. Embodiments described herein also relate to the apparatus, such computers and microcontrollers, for performing these operations. These apparatus and processes may be employed to control the wafer positioning parameters of methods described and apparatus designed to implement them. The control apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method steps.

Patterning Method/Apparatus:

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. In one embodiment, a lithography tool patterns a wafer to define vias and trenches that are filled using a copper electrodeposition tool. The methods herein are used to immerse the wafer, for example having a copper seed layer, into an electrolyte bath and the features thereon are filled with, for example, copper. Further, the method includes one or more steps (1)-(6) described above.

EXAMPLES

The invention is further understood by reference to the following examples, which are intended to be exemplary. The present invention is not limited in scope by the exemplified embodiments, which are intended as illustrations of aspects of the invention only. Any methods that are functionally equivalent are within the scope of the invention. Various modifications of the invention in addition to those described herein will become apparent to those skilled in the art from the foregoing description and accompanying figures. Moreover, such modifications fall within the scope of the appended claims, for example, one of ordinary skill in the art would appreciate that certain materials, although currently unavailable, will become available as equivalents and/or alternatives to materials described herein.

Example 1

Wafer wetting behavior was studied using a Clamshell (supra) wafer holder using methods described herein of immersing a wafer into a plating solution. A 300 mm wafer was used in these studies. Wafers were immersed in the electrolyte using conventional trapezoidal Z-speed profiles, for example as described in relation to FIGS. 3 and 4, and also using methods in accord with embodiments described herein, for example as described in relation to FIGS. 6 and 7. The wafers were tilted, rotated, and then immersed as described. The wafer surface quality resulting from conventional vs. improved immersions was then compared.

Wafers immersed using trapezoidal Z-speed immersion showed evidence of increased air entrapment and wetting wave front collapse in relation to the wafers immersed using the improved methods. The wafers immersed using conventional trapezoidal Z-speed immersion had much higher levels of non-wetted areas on the plating surface.

Figure 8:
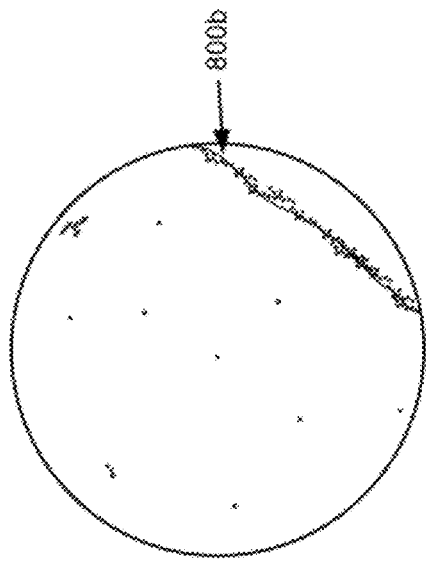
FIG. 8 is a representation of a wetting front propagation on a wafer plating surface upon initial entry of a wafer into an electrolyte, and the same wetting front propagation on the latter half of a wafer plating surface, when a conventional trapezoidal Z-speed immersion is used.
Figure 8:
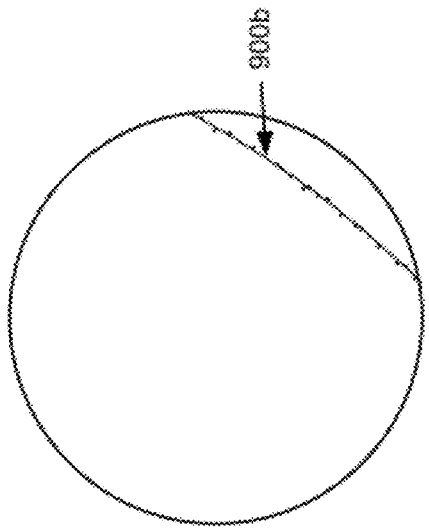
Figure 8:
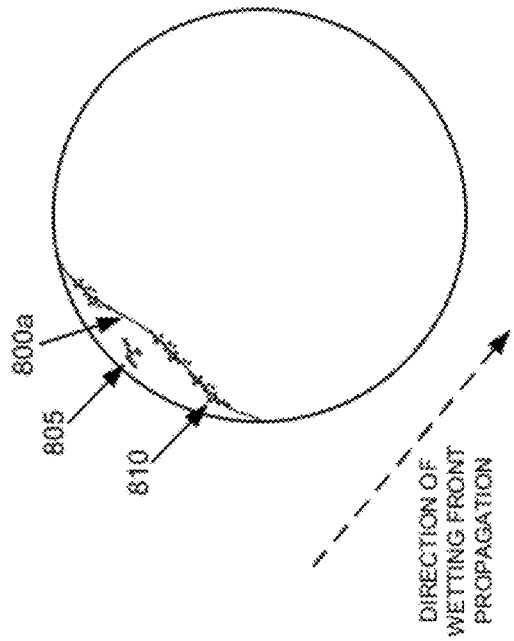

FIG. 8 is a representation of a wetting front propagation at a snapshot in time on a wafer plating surface upon initial entry of a wafer into an electrolyte (left), and the same wetting front propagation at a later snapshot in time on the latter half of the wafer plating surface (right), when a conventional trapezoidal Z-speed immersion is used. In FIG. 8, the direction of the wetting wave front propagation is indicated by the dotted arrow, that is, from the top left (as drawn) of the wafer surface toward bottom right of the wafer surface. In this example, the wafer holder/wafer entered the electrolyte at 100 mm/s (constant speed). Contact line, 800a, indicates the wetting front where the electrolyte meets the wafer. The portion of the wafer to the left of line 800a is the immersed portion of the wafer upon impact with the electrolyte. In the region where the wafer impacts the electrolyte, 805, there is evidence of air entrapment and poor wetting observed. For example, non-wetted areas 805 remain on the wafer after immersion. The impact area can be determined, for example, by indexing the wafer and tracking which portion impacts the electrolyte first. Also, non-wetted areas over the surface of the wafer (post immersion) are evidence of bubbles, 810, moving with the wetting wave front 800a during immersion. Since the speed is maintained at a substantially constant 100 mm/s, the wetting front builds up and eventually collapses, as indicated by 800b, forming large amounts of bubbles that are carried across (some left behind on the wafer surface) by the wave front.

Figure 9:
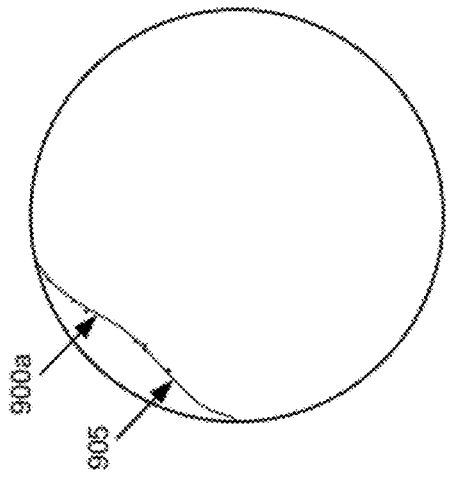
FIG. 9 is a representation of a wetting front propagation on a wafer plating surface upon initial entry of a wafer into an electrolyte, and the same wetting front propagation on the latter half of a wafer plating surface, when a Z-speed immersion method as described herein is used.

FIG. 9 is a representation of a wetting front propagation at a snap shot in time on a wafer plating surface upon initial entry of a wafer into an electrolyte (left), and the same wetting front propagation at a later snap shot in time on the latter half of a wafer plating surface (right), when an improved Z-speed immersion method as described herein is used. In this example, the wafer holder/wafer entered the electrolyte at 150 mm/s (in this example while decelerating). As evidenced by very few non-wetted areas in the impact area, left of wetting line 900a, air entrapment is minimized using these methods. Also, as evidenced by few non-wetted areas across the entire plating surface (post immersion), the wetting front, 905, carries little if any bubbles with it as it propagates across the wafer surface. These tests show that higher initial entry speeds decrease air entrapment and improve wetting.

In this example, upon entry of the wafer into the electrolyte at 150 mm/s, the Z-speed is gradually reduced down to about 60 mm/s up to the point when about half of the wafer is immersed into the solution. Deceleration as described results in gradual reduction in the wave front buildup so that the wetting front is maintained in a stable form and does not collapse. Since the volume of the wafer holder immersed into the solution roughly increases by the square of the vertical displacement, further reduction in the Z-speed much beyond the first half of the wafer immersion does not prevent eventual wave breakup. Nevertheless, the intensity of the wave breakup is still lower as compared to a typical trapezoidal profile as shown in FIG. 8. However, when the Z-speed is accelerated after reaching the second speed (a local speed minima on the Z-speed curve, e.g. as in FIG. 6), for example, during immersion of the second half of the wafer, wave front collapse is avoided. This is depicted by 900b. It is believed that the Z-speed acceleration during immersion of the latter portion of the wafer increases the bulk velocity of the plating solution underlying the wetting wave front traversing the bulk solution and thereby minimizes the difference between bulk solution velocity and wave velocity enough to avoid wave front collapse. FIG. 9 shows that the wave front 900b exhibits much less bubble formation and foaming across the wafer. These results are supported by actual electroplating studies performed after immersions as described above. These electroplating studies are described in Example 2.

Example 2

Figure 10:
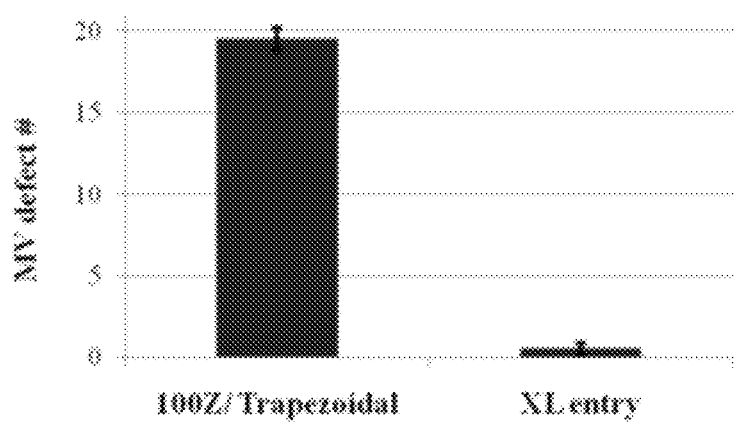
FIG. 10 is a graph showing improved wafer film quality when using methods described herein as compared to a conventional trapezoidal Z-speed immersion profile.

FIG. 10 is a graph showing improved wafer film quality when using methods described herein as compared to a trapezoidal Z-speed immersion profile. Electroplating was performed on the tool using a number of patterned wafers which were immersed using both conventional trapezoidal Z-speed profiles (labeled "100Z/Trapezoidal" in FIG. 10) as compared to those in accord with the embodiments described herein (labeled "XL entry" in FIG. 10). The defect count related to the bubble and poor wetting is reflected in the count of the number of margin voids (MV) in the metrology tool. The margin void count was reduced (average of 0.55 runs) from over 19 counts using the conventional trapezoidal Z-speed profile (100 mm/s) to less than one count for a Z-speed profile in accord with that described in relation to FIG. 6.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A method of immersing a wafer into an electrolyte of a plating bath, the method comprising:
   (a) positioning the wafer horizontally at a first height above the electrolyte, wherein a planar plating surface of the wafer is parallel to a plane defined by the surface of the electrolyte;
   (b) tilting the wafer at an angle such that the planar plating surface of the wafer is no longer parallel to the plane defined by the surface of the electrolyte;
   (c) moving the wafer at a first speed toward the electrolyte along a trajectory substantially normal to the plane defined by the surface of the electrolyte;
   (d) decelerating the wafer from the first speed to a second speed, the leading edge of the wafer entering the electrolyte at the first speed or during the deceleration from the first speed to the second speed wherein the second speed is greater than zero;
   (e) accelerating the wafer from the second speed to a third speed, wherein the acceleration is continued until a substantial portion of the planar plating surface of the wafer is immersed in the electrolyte; and
   (f) decelerating the wafer from the third speed to a stop at a second height; wherein the planar plating surface of the wafer is totally immersed in the electrolyte at the third speed or during the deceleration from the third speed to the stop.

2. The method of claim 1, further comprising rotating the wafer along an axis normal to the planar plating surface of the wafer and which passes through the center of the wafer, at a first rotational speed.

3. The method of claim 2, wherein the first rotational speed is between about 10 rpm and 180 rpm for a 200 mm wafer, between about 5 rpm and 180 rpm for a 300 mm wafer, and between about 5 rpm and 150 rpm for a 450 mm wafer.

4. The method of claim 2, wherein the wafer is rotated at a second rotational speed after immersion in the electrolyte.

5. The method of claim 2, wherein the deceleration from the first speed to the second speed is continued until between about 25% and about 75% of the planar plating surface of the wafer is immersed in the electrolyte.

6. The method of claim 5, wherein the deceleration from the first speed to the second speed is continued until about 50% of the planar plating surface of the wafer is immersed in the electrolyte.

7. The method of claim 6, wherein the leading edge of the wafer enters the electrolyte during the deceleration to the second speed.

8. The method of claim 1, wherein the first speed is between about 120 mm/s and about 300 mm/s.

9. The method of claim 8, wherein the second speed is between about 40 mm/s and about 110 mm/s.

10. The method of claim 8, wherein the second speed is between about 50 mm/s and about 70 mm/s.

11. The method of claim 8, wherein the second speed is between about 55 mm/s and about 65 mm/s.

12. The method of claim 9, wherein the third speed is between about 100 mm/s and about 140 mm/s.

13. The method of claim 9, wherein the third speed is between about 120 mm/s and about 140 mm/s.

14. The method of claim 9, wherein the third speed is between about 130 mm/s and about 140 mm/s.

15. The method of claim 1, wherein the first speed is between about 120 mm/s and about 175 mm/s.

16. The method of claim 1, wherein the first speed is between about 120 mm/s and about 160 mm/s.

17. The method of claim 1, wherein the third speed is less than the first speed.

18. The method of claim 1, wherein the wafer is tilted at an angle of 5 degrees or less.

19. The method of claim 1, wherein the wafer is tilted at an angle of between about 3 degrees and about 5 degrees.

20. The method of claim 1, wherein the wafer is totally immersed in the electrolyte during deceleration from the third speed to the stop.

21. The method of claim 1, wherein the total time for immersion, from the time the leading edge of the wafer enters the electrolyte until the wafer is completely immersed in the electrolyte, is less than 200 milliseconds.

22. The method of claim 1, wherein the second height is between about 15 mm and about 25 mm below the surface of the electrolyte.

23. The method of claim 1, further comprising: changing the angle of the wafer tilt during immersion of the wafer.

24. The method of claim 1, further comprising increasing the angle of the wafer tilt, after the tilted wafer initially contacts the electrolyte.

25. The method of claim 1, further comprising decreasing the angle of the wafer tilt, after the tilted wafer initially contacts the electrolyte to an angle greater than 0 but less than 5 degrees.

26. The method of claim 1 further comprising the steps of:
applying photoresist to the workpiece;
exposing the photoresist to light;
patterning the resist and transferring the pattern to the workpiece; and
selectively removing the photoresist from the work piece.

27. A plating apparatus comprising:
(a) a wafer holder configured to tilt a wafer from horizontal during immersion into a plating solution;
(b) a chamber for holding said plating solution; and
(c) a controller having program instructions to perform a method comprising the steps of:
(i) positioning the wafer horizontally at a first height above the electrolyte, wherein a planar plating surface of the wafer is parallel to a plane defined by the surface of the electrolyte;
(ii) tilting the wafer at an angle such that the planar plating surface of the wafer is no longer parallel to the plane defined by the surface of the electrolyte;
(iii) moving the wafer at a first speed toward the electrolyte along a trajectory substantially normal to the plane defined by the surface of the electrolyte;
(iv) decelerating the wafer from the first speed to a second speed, the leading edge of the wafer entering the electrolyte at the first speed or during the deceleration from the first speed to the second speed wherein the second speed is greater than zero;
(v) accelerating the wafer from the second speed to a third speed, wherein the acceleration is continued until a substantial portion of the planar plating surface of the wafer is immersed in the electrolyte; and
(vi) decelerating the wafer from the third speed to a stop at a second height; wherein the planar plating surface of the wafer is totally immersed in the electrolyte at the third speed or during the deceleration from the third speed to the stop.

28. A system comprising the apparatus of claim 27 and a stepper.

* * * * *